United States Patent
Gong

(10) Patent No.: US 9,343,701 B2
(45) Date of Patent: May 17, 2016

(54) ORGANIC LIGHT EMITTING DISPLAY DEVICE AND METHOD FOR MANUFACTURING THE SAME

(71) Applicant: SAMSUNG DISPLAY CO., LTD., Yongin, Gyeonggi-Do (KR)

(72) Inventor: Su-Cheol Gong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 14/453,578

(22) Filed: Aug. 6, 2014

(65) Prior Publication Data

US 2015/0041794 A1 Feb. 12, 2015

(30) Foreign Application Priority Data

Aug. 12, 2013 (KR) ........................ 10-2013-0095195

(51) Int. Cl.
| | | |
|---|---|---|
| H01L 21/00 | (2006.01) | |
| H01L 51/52 | (2006.01) | |
| H01L 29/08 | (2006.01) | |
| H01L 35/24 | (2006.01) | |
| H01L 51/00 | (2006.01) | |

(52) U.S. Cl.
CPC ........ *H01L 51/5253* (2013.01); *H01L 51/5246* (2013.01)

(58) Field of Classification Search
None
See application file for complete search history.

(56) References Cited

U.S. PATENT DOCUMENTS

| | | | | |
|---|---|---|---|---|
| 2007/0170423 | A1* | 7/2007 | Choi | ........................ C03C 8/24 257/40 |
| 2008/0138633 | A1 | 6/2008 | Park et al. | |
| 2009/0215279 | A1 | 8/2009 | Kim et al. | |
| 2010/0096984 | A1 | 4/2010 | Kim | |
| 2012/0132953 | A1* | 5/2012 | Becker | ................. H01L 51/448 257/100 |

FOREIGN PATENT DOCUMENTS

| | | |
|---|---|---|
| KR | 10-0670382 | 1/2007 |
| KR | 10-2008-0054071 | 6/2008 |
| KR | 10-2009-0091556 | 8/2009 |
| KR | 10-2010-0044624 | 4/2010 |
| KR | 10-2012-0001778 | 1/2012 |

OTHER PUBLICATIONS

Han, Yun Cheol et al., "A flexible moisture barrier comprised of a $SiO_2$-embedded organic-inorganic hybrid nanocomposite and $Al_2O_3$ for thin-film encapsulation of OLEDs", Organic Electronics, Mar. 29, 2013, pp. 1435-1440, vol. 14.

(Continued)

*Primary Examiner* — Calvin Choi
(74) *Attorney, Agent, or Firm* — Lewis Roca Rothgerber Christie LLP

(57) ABSTRACT

An organic light-emitting display device includes a pixel array on a first substrate, a second substrate disposed above the first substrate to face the pixel array, a sealant between the first and second substrates to surround the pixel array, and a barrier layer on outer surfaces of the first substrate, the second substrate, and the sealant.

26 Claims, 4 Drawing Sheets

(56) References Cited

OTHER PUBLICATIONS

Jin, Jungho et al., "Silica nanoparticle-embedded sol-gel organic/inorganic hybrid nanocomposite for transparent OLED encapsulation", Organic Electronics, Oct. 11, 2011, pp. 53-57, vol. 13.

Meyer, J. et al., "The origin of low water vapor transmission rates through $Al_2O_3/ZrO_2$ nanolaminate gas-diffusion barriers grown by atomic layer deposition", Applied Physics Letters, Jun. 17, 2010, pp. 243308-1 through 243308-3, vol. 96.

* cited by examiner

ORGANIC LIGHT EMITTING DISPLAY DEVICE AND METHOD FOR MANUFACTURING THE SAME

CROSS-REFERENCE TO RELATED APPLICATION

This application claims priority to and the benefit of Korean Patent Application No. 10-2013-0095195, filed on Aug. 12, 2013, in the Korean Intellectual Property Office, the disclosure of which is incorporated herein by reference in its entirety.

BACKGROUND

1. Field

An aspect of the present invention relates to an organic light-emitting display device and a method for manufacturing the same.

2. Description of the Related Art

An organic light-emitting display device includes a substrate on which a pixel array is formed and a container or encapsulating substrate disposed to face (e.g., opposite to) the substrate and bonded to the substrate by a sealant, such as epoxy, in order to encapsulate the pixel array.

The pixel array includes scan lines, data lines, and a plurality of pixels connected in a matrix form between the scan lines and the data lines.

Each pixel may include an organic light-emitting diode. The organic light-emitting diode includes an anode electrode, a cathode electrode, and an organic thin-film layer formed between the anode and cathode electrodes. The organic thin-film layer, such as a hole transport layer, an organic emissive layer, or an electron transport layer, may include an organic material.

Each pixel may further include a transistor configured to control an operation of the organic light-emitting diode and a capacitor configured to maintain a signal.

SUMMARY

Aspects of embodiments of the present invention provide an organic light-emitting display device and a method for manufacturing the same having an improved bonding force between a sealant and a substrate and/or improved sealing characteristics.

According to an embodiment of the present invention, there is provided an organic light-emitting display device including a pixel array on a first substrate, a second substrate disposed above the first substrate to face the pixel array, a sealant between the first and second substrates to surround the pixel array, and a barrier layer on outer surfaces of the first substrate, the second substrate, and the sealant.

The sealant may be a polymer resin.

The polymer resin may be a photocurable polymer resin.

The photocurable polymer resin may include at least one material selected from the group consisting of an epoxy-based material, a urethane-based material, a polyethylene-based material, and a polyimide-based material.

The sealant may have a width of about 50 µm to about 1000 µm.

The barrier layer may be on side surfaces of the first and second substrates and an outer surface of the sealant.

The barrier layer may be on side surfaces and outer surfaces of the first and second substrates and an outer surface of the sealant.

The barrier layer may be an inorganic material having a transmittance of 90% or more.

The inorganic material may include at least one material selected from the group consisting of aluminum oxide, zirconium oxide, and hafnium oxide.

The barrier layer may have a thickness of about 10 m to about 1000 nm.

The barrier layer may be a multi-layered structure.

The sealant may include a nano particle.

The nano particle may include at least one inorganic material selected from the group consisting of silicon oxide and aluminum oxide.

According to another embodiment of the present invention, there is provided a method for manufacturing an organic light-emitting display device, the method includes forming a pixel array on a first substrate, applying a sealant on a second substrate to surround the pixel array, disposing the second substrate above the first substrate to face the pixel array, bonding the sealant to the first and second substrates, and forming a barrier layer on outer surfaces of the first substrate, the second substrate, and the sealant.

The sealant may be a polymer resin.

The polymer resin may be a photocurable polymer resin.

The photocurable polymer resin may include at least one material selected from the group consisting of an epoxy-based material, a urethane-based material, a polyethylene-based material, and a polyimide-based material.

The sealant may be formed to have a width of about 50 µm to about 1000 µm.

The bonding of the sealant to the first and second substrates may include irradiating ultraviolet (UV) or infrared (IR) light onto the sealant.

The barrier layer may be formed on side surfaces of the first and second substrates and an outer surface of the sealant.

The barrier layer may be formed on side surfaces and outer surfaces of the first and second substrates and an outer surface of the sealant.

The barrier layer may be an inorganic material having a transmittance of 90% or more.

The inorganic material may include at least one material selected from the group consisting of aluminum oxide, zirconium oxide, and hafnium oxide.

The barrier layer may be formed to have a thickness of about 10 nm to about 1000 nm.

The barrier layer may be formed as a multi-layered structure.

The barrier layer may be formed at a temperature of about 100° C. or less using chemical vapor deposition (CVD).

The sealant may include a nano particle.

The nano particle may include at least one inorganic material selected from the group consisting of silicon oxide and aluminum oxide.

The bonding of the sealant to the first and second substrates may include inserting a mask between a UV or IR light source and the first and second substrates, the mask may have a transmission portion corresponding to the sealant.

BRIEF DESCRIPTION OF THE DRAWINGS

Example embodiments will now be described more fully hereinafter with reference to the accompanying drawings; however, the present invention may be embodied in different forms and should not be construed as limited to the embodiments set forth herein.

In the accompanying drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
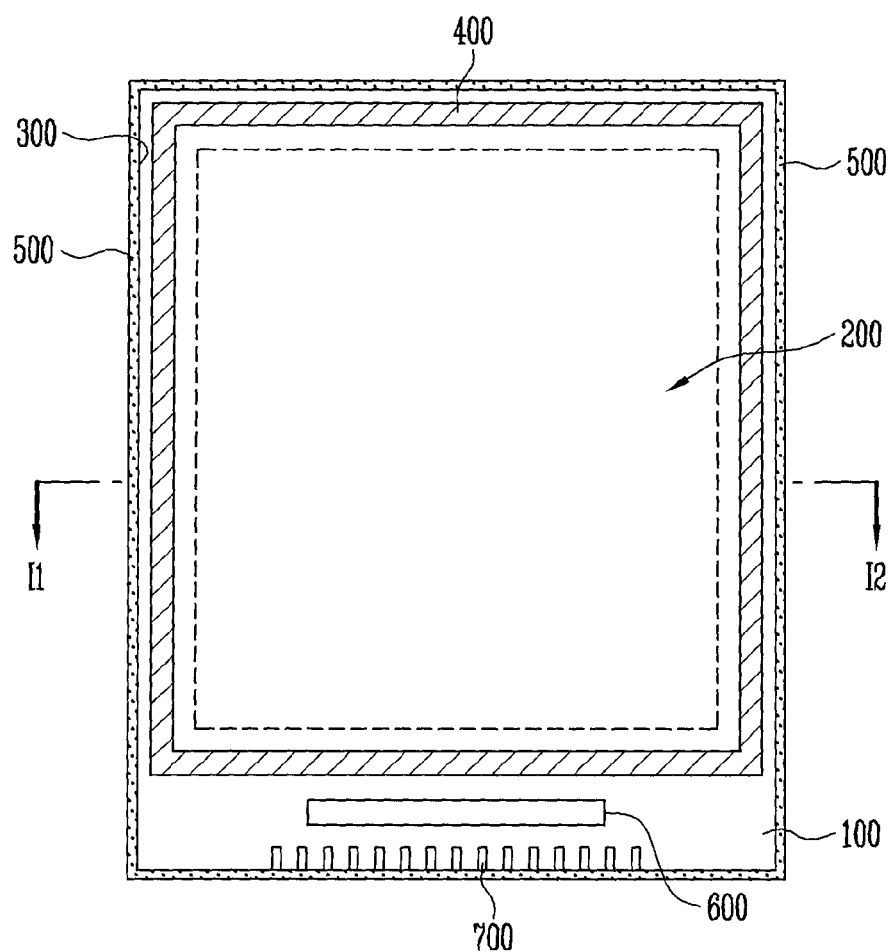
FIG. 1 is a plan view illustrating an organic light-emitting display device according to an embodiment of the present invention.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

These embodiments are provided so that this disclosure will be thorough and complete, and will fully convey the present invention to those skilled in the art. Expressions such as "at least one of," when preceding a list of elements, modify the entire list of elements and do not modify the individual elements of the list. Further, the use of "may" when describing embodiments of the present invention refers to "one or more embodiments of the present invention." It will be understood that when an element is referred to as being "between" two elements, it can be the only element between the two elements, or one or more intervening elements may also be present. Like reference numerals refer to like elements throughout.

Figure 2:
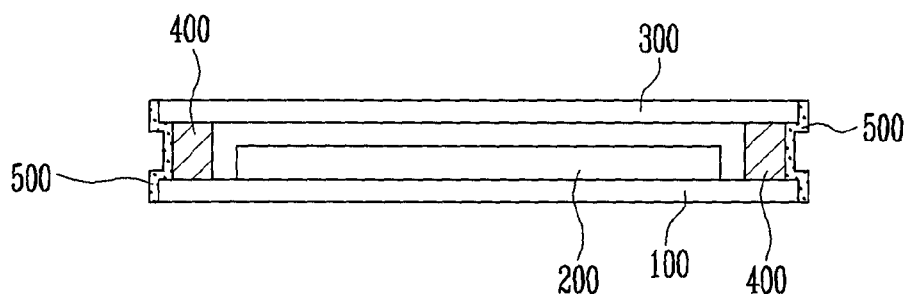
FIG. 2 is a sectional view taken along the line I1-I2 of FIG. 1.
Figure 3:
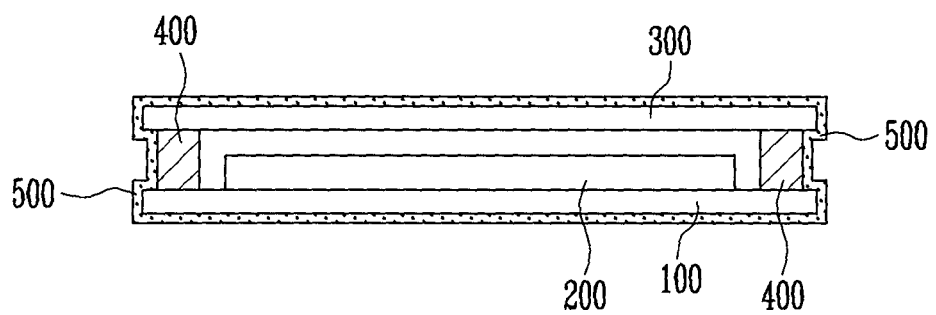
FIG. 3 is a sectional view taken along the line I1-I2 of FIG. 1 of an alternative configuration.

FIG. 1 is a plan view illustrating an organic light-emitting display device according to an embodiment of the present invention. FIGS. 2 and 3 are sectional views taken along the line I1-I2 of FIG. 1 of alternative configurations.

Referring to FIGS. 1 to 3, the organic light-emitting display device includes a pixel array 200 formed on a first substrate 100, a second substrate 300 disposed above the first substrate 100 including the pixel array 200, a sealant 400 disposed between the first and second substrates 100 and 300 to surround the pixel array 200, and a barrier layer 500 formed on outer surfaces of the first substrate 100, the second substrate 300, and the sealant 400.

The barrier layer 500, as shown in FIG. 2, may be formed on side surfaces of the first and second substrates 100 and 300 and an outer surface of the sealant 400, i.e., on only a side surface (e.g., a sidewall) of the organic light-emitting display device. Alternatively, the barrier layer 500, as shown in FIG. 3, may be formed on side surfaces and outer surfaces (e.g., rear surfaces) of the first and second substrates 100 and 300 and on an outer surface of the sealant 400, i.e., on the entire outer surface of the organic light-emitting display device.

A driving circuit 600 for driving the pixel array 200 and a pad portion 700 coupled (e.g., electrically coupled) to an external circuit to input a signal to the driving circuit 600 may be formed on the first substrate 100 at the outside of the sealant 400.

The first and second substrates 100 and 300 may be formed in the shape of a thin film and be made of glass, silicon, plastic, metal, etc. Alternatively, the first and second substrates 100 and 300 may be formed in the shape of a thin film and have flexibility, and in which case can be made of plastic, metal, etc. The first and second substrates 100 and 300 may be formed to be transparent.

The pixel array 200 constitutes a display unit in which an image is displayed.

Figure 4:
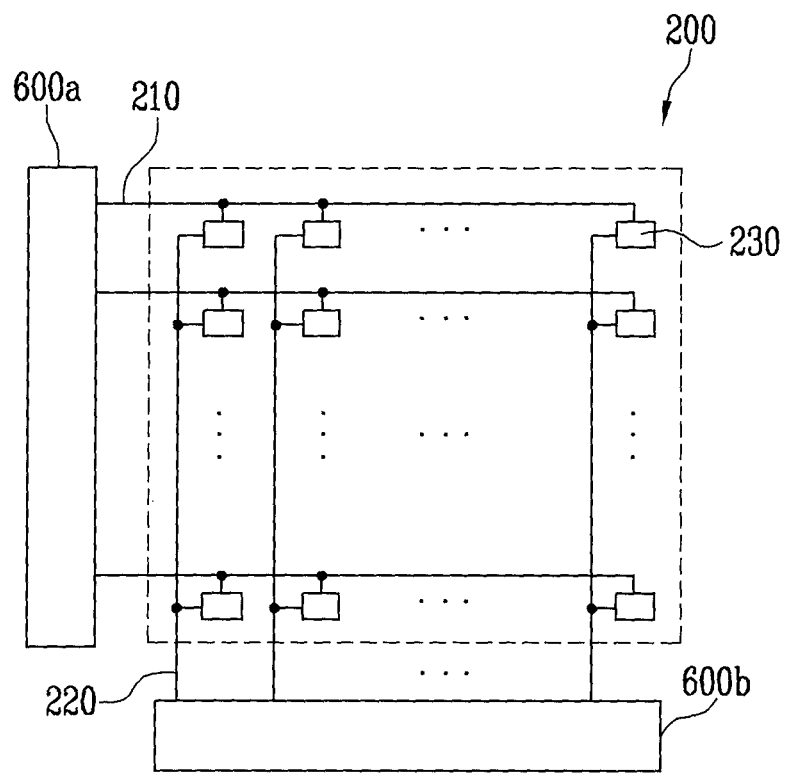
FIG. 4 is a plan view illustrating a pixel array of FIG. 1.

Referring to FIG. 4, the pixel array 200 includes a plurality of scan lines 210 arranged in one direction, a plurality of data lines 220 arranged to cross or intersect the scan lines 210 (e.g., arranged in a direction substantially perpendicular to the plurality of scan lines 210), and a plurality of pixels 230 connected between or at crossing regions of the scan lines 210 and the data lines 220. The pixel 230 is a light-emitting device and may include an organic light-emitting diode.

Figure 5:
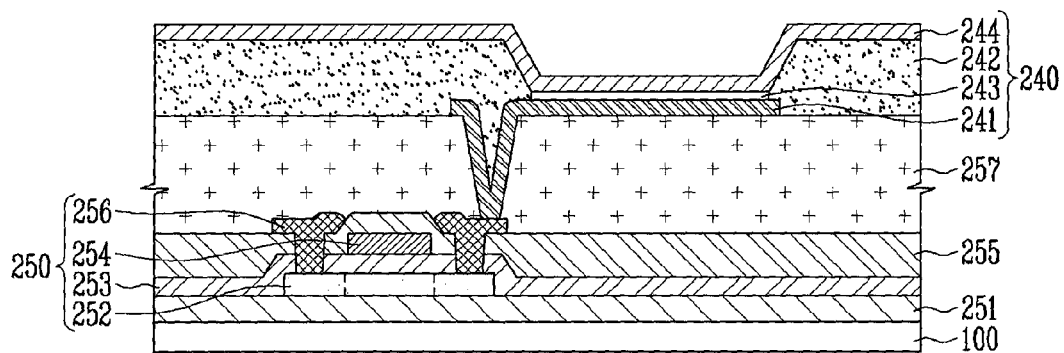
FIG. 5 is a sectional view illustrating the pixel array of FIG. 1.

Referring to FIG. 5, an organic light-emitting diode 240 includes a first electrode 241, a second electrode 244, and an organic thin-film layer 243 interposed between the first and second electrodes 241 and 244. The organic thin-film layer 243 is formed on the first electrode 241 in an opening (e.g., a light-emitting region) defined by a pixel defining layer 242, and may include a hole injection layer, a hole transport layer, an organic emissive layer, an electron transport layer, or an electron injection layer.

A thin-film transistor for transmitting (e.g., configured to transmit) a signal and a capacitor for maintaining a signal (e.g., configured to maintain a signal) may be connected to the organic light-emitting diode 240.

Referring to FIG. 5, a thin-film transistor (TFT) 250 includes a semiconductor layer 252 configured to have (e.g., provide) source, drain, and channel regions, a gate electrode 254 insulated from the semiconductor layer 252 by a gate insulating layer 253, and a source or drain electrode 256 connected (e.g., electrically connected) to the semiconductor layer 252 in the source or drain region through a contact hole formed in an insulating layer 255 and the gate insulating layer 253. Here, reference numeral 251 represents a buffer layer, and reference numeral 257 represents a planarization insulating layer.

A protective layer for protecting the organic light-emitting diode 240 may be formed on the first substrate 100 including the pixel array 200 configured as described above.

Referring to FIG. 4, the driving circuit 600 may include a scan driving circuit 600a connected to the plurality of scan lines 210 and a data driving circuit 600b connected to the plurality of data lines 220. The scan and data driving circuits 600a and 600b may be configured with one integrated circuit (IC).

Referring to FIGS. 2 and 3, the sealant 400 is disposed between the first and second substrates 100 and 300 to surround the pixel array 200. The sealant 400 is bonded to the first and second substrates 100 and 300 so that an internal space including the pixel array 200 is sealed.

The sealant 400 may be formed of a photocurable polymer resin which can be cured using ultraviolet (UV) or infrared (IR) light. The photocurable polymer resin may include, for example, at least one material selected from the group consisting of an epoxy-based material, a urethane-based material, a polyethylene-based material, and a polyimide-based material.

In one embodiment, the sealant 400 is formed to have a width (e.g., a width along a surface of the first or second substrate) of about 50 µm to about 1000 µm. In a case where the width of the sealant 400 is not more than 50 µm, the bonding area of the sealant 400 with the first and second substrates 100 and 300 may be insufficient, and therefore, the sealant 400 may be easily exfoliated. In a case where the width of the sealant 400 is not less than 1000 µm, the area occupied by the sealing region of the sealant 400 is increased, and therefore, it may be difficult to sufficiently limit the size of the display unit.

In one embodiment, the barrier layer 500 is formed of an insulative inorganic material which can reduce or prevent the penetration of moisture and/or oxygen and physically maintain a constant strength. In one embodiment, the inorganic material has a transmittance of 90% or more so that the transmittance and/or brightness of the display unit are not reduced or affected. The inorganic material may include, for example, at least one material selected from the group consisting of aluminum oxide (e.g., $Al_2O_3$), zirconium oxide (e.g., $ZrO_2$), and hafnium oxide (e.g., $HfO_2$).

The barrier layer 500 may be formed into a single- or multi-layered structure including the inorganic material. In one embodiment, the barrier layer 500 is formed to have a thickness of about 10 nm to about 1000 nm. In a case where the thickness of the barrier layer 500 is not more than 10 nm, it may be difficult to effectively reduce or block the penetration of oxygen and/or moisture therethrough. In a case where the thickness of the barrier layer 500 is not less than 1000 nm, the transmittance and/or brightness of the display unit may be reduced or affected.

Figure 6:
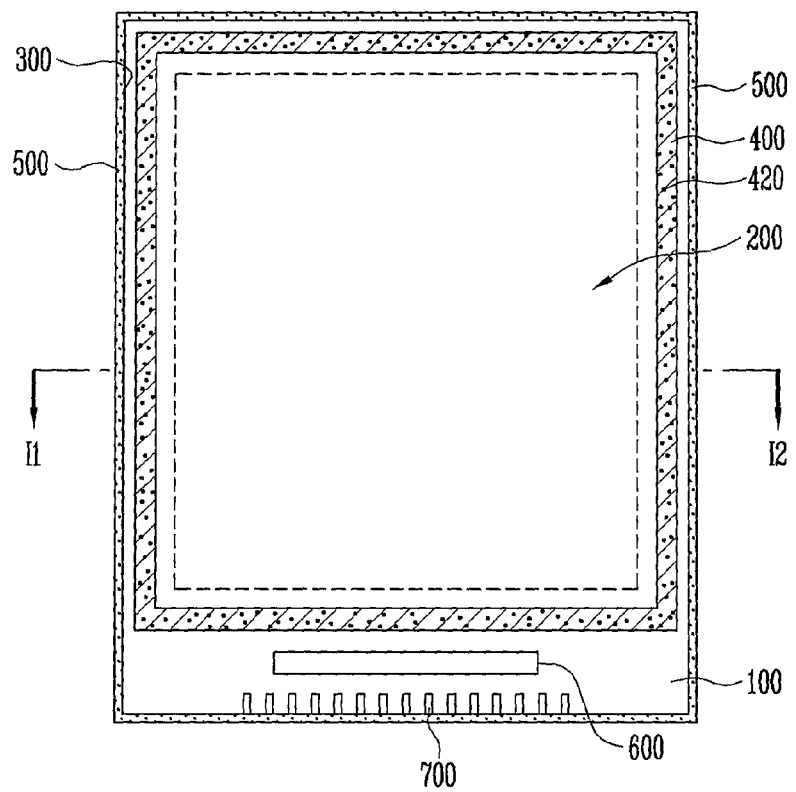
FIG. 6 is a plan view illustrating an organic light-emitting display device according to another embodiment of the present invention.

FIG. 6 is a plan view illustrating an organic light-emitting display device according to another embodiment of the present invention.

Referring to FIG. 6, the organic light-emitting display device according to this embodiment has a structure similar to that of the embodiment shown in FIG. 1, but a nano particle 420 is included in the sealant 400. The nano particle 420 may include, for example, at least one inorganic material selected from the group consisting of silicon oxide (e.g., $SiO_2$) and aluminum oxide (e.g., $Al_2O_3$).

The sealant 400 including the nano particle 420 has a low water vapor transmission rate (WVTR), thereby more effectively reducing or preventing the penetration of oxygen and/or moisture therethrough. Further, the sealant 400 may have improved bonding strength (e.g., bonding force) with the first and second substrates 100 and 300 and improved mechanical strength, thereby improving sealing characteristics.

Hereinafter, a method for manufacturing an embodiment of the present invention will be described in further detail.

FIGS. 7A to 7E are sectional views illustrating a method for manufacturing an organic light-emitting display device according to an embodiment of the present invention.

Figure 7A:
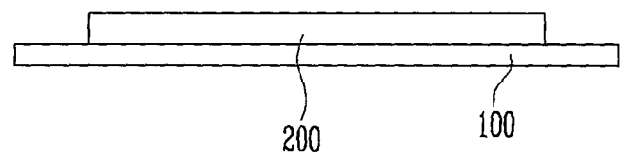
FIGS. 7A to 7E are sectional views illustrating a method for manufacturing an organic light-emitting display device according to an embodiment of the present invention.

Referring to FIG. 7A, a pixel array 200 is formed on a first substrate 100.

The pixel array 200, as shown in FIG. 4, includes a plurality of scan lines 210 arranged in one direction, a plurality of data lines 220 arranged to intersect or cross the scan lines 210, and a plurality of pixels 230 connected to (e.g., between) the scan lines 210 and the data lines 220. The pixel 230 is a light-emitting device and may include an organic light-emitting diode, a thin-film transistor for transmitting a signal, and a capacitor for maintaining a signal.

Referring to FIG. 5, a thin-film transistor (TFT) 250, a capacitor, and an organic light emitting diode 240 connected (e.g., electrically connected) to the thin film transistor 250 may be formed (e.g., sequentially formed) on the first substrate 100.

Figure 7B:
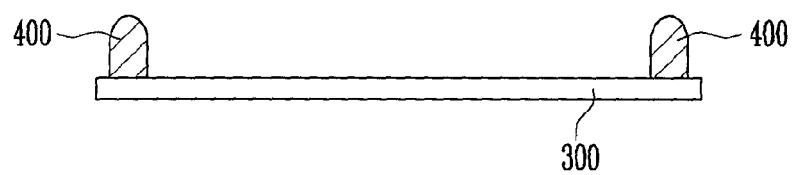

Referring to FIG. 7B, a sealant 400 is applied on a second substrate 300 so as to surround the pixel array 200.

The sealant 400 may be formed of, for example, at least one material selected from the group consisting of an epoxy-based material, a urethane-based material, a polyethylene-based material, and a polyimide-based material.

For example, the sealant 400 may be formed by coating a polymer resin, in a liquid or gel state, using a screen printing technique or dispensing technique to have a width of about 50 µm to about 1000 µm. In a case where the polymer resin in the liquid state is used, the polymer resin may be preliminary cured in order to maintain the coated shape thereof.

Figure 7C:
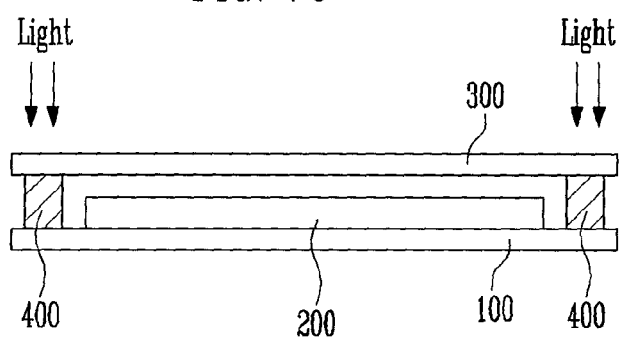

Referring to FIG. 7C, the second substrate 300 is disposed above the first substrate 100 including the pixel array 200, and light, such as ultraviolet (UV) or infrared (IR) light, is irradiated onto an outer surface (e.g., a rear surface) of the second substrate 300, thereby bonding the sealant 400 to the first and second substrates 100 and 300. As heat is generated due to the absorption of the UV or IR light by the sealant 400, the sealant 400 may be cured in a state in which the sealant 400 is bonded to the first and second substrates 100 and 300.

A mask may be used so that the UV or IR light is not irradiated onto the pixel array 200. Because a transmission portion or opening portion corresponding to the sealant 400 may be formed in the mask, the UV or IR light can be irradiated therethrough and onto only the sealant 400.

Figure 7D:
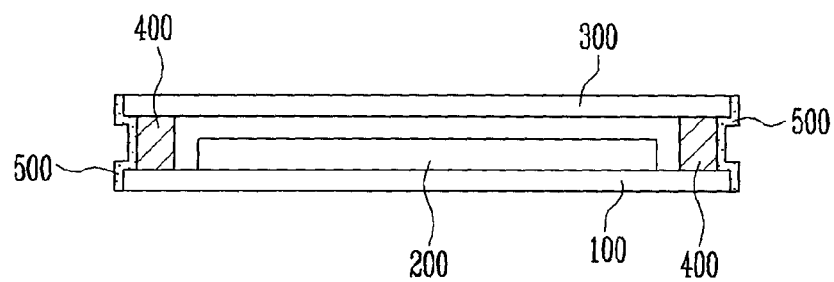
Figure 7E:
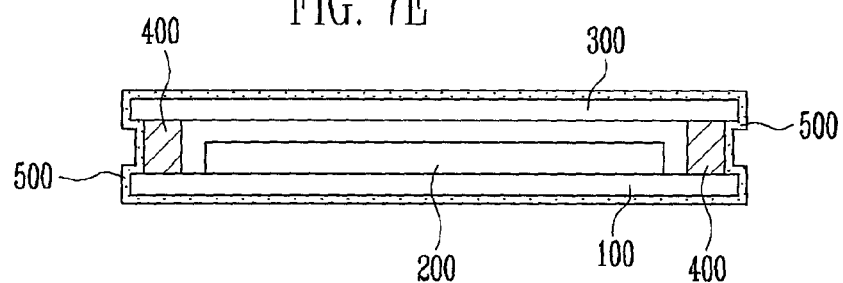

Referring to FIGS. 7D and 7E, a barrier layer 500 is formed on outer surfaces of the first substrate 100, the second substrate 300, and the sealant 400.

The barrier layer 500, as shown in FIG. 2, may be formed on side surfaces of the first and second substrates 100 and 300 and on an outer surface of the sealant 400, i.e., only on a side surface (e.g., a sidewall) of the organic light-emitting display device (see FIG. 7D). Alternatively, the barrier layer 500, as shown in FIG. 3, may be formed on side surfaces and outer surfaces (e.g., rear surfaces) of the first and second substrates 100 and 300 and on an outer surface of the sealant 400, i.e., on the entire outer surface of the organic light-emitting display device (see FIG. 7E). The barrier layer 500 may be formed as a single- or multi-layered structure.

The barrier layer 500 may be formed of an insulative inorganic material. The inorganic material may include, for example, at least one material selected from the group consisting of aluminum oxide (e.g., $Al_2O_3$), zirconium oxide (e.g., $ZrO_2$), and hafnium oxide (e.g., $HfO_2$).

For example, the barrier layer 500 may be formed by depositing the inorganic material to have a thickness of about 10 nm to about 1000 nm on the side surface (e.g., the sidewall) or on the entire outer surface of the organic light-emitting display device at a relatively low temperature of, for example, 100° C. or less, using chemical vapor deposition such as atomic layer deposition (ALD), metal organic chemical vapor deposition (MOCVD), or plasma enhanced chemical vapor deposition (PECVD).

If the sealant 400 is formed to include a frit, it is possible to more effectively reduce or block the penetration of oxygen and/or moisture therethrough. However, the frit may have inferior bonding characteristics or may be easily exfoliated due to a difference in thermal expansion coefficients between the frit and the substrate, for instance, during the process of bonding the frit to the substrate using, for example, a laser.

The sealant 400 formed with the polymer resin may be less effective at reducing or blocking the penetration of oxygen and/or moisture as compared with the sealant 400 including the frit. However, the sealant 400 formed with the polymer resin has an adhesive strength higher than that of the sealant 400 formed to include the frit and can be cured using relatively low-temperature light. Hence, a defect caused by relatively high-temperature heat may not occur.

In this embodiment, the sealant 400 is formed with the polymer resin, and the barrier layer 500 is coated on the entire outer surface of the display device in order to offset the less effecting reducing or blocking the penetration of oxygen and/or moisture of the polymer resin as compared with the sealant 400 formed to include the frit.

If the sealant is formed to include the frit, the organic material may be degraded by heat of a relatively high temperature (for example, about 400° C. to about 500° C. or more), which is generated when the laser is irradiated to the sealant 400 including the frit. However, in this embodiment, the sealant 400 is formed with the polymer resin which can be cured using light with a relatively low temperature, and the barrier layer 500 is formed with the inorganic material which can be deposited at a relatively low temperature of, for example, about 100° C. or less. Accordingly, it is possible to reduce or prevent a reduction of reliability and stability caused by the degradation of the organic material.

By way of summation and review, an organic light-emitting diode is susceptible to hydrogen and oxygen because the organic light-emitting diode includes an organic material. In a case where moisture and/or oxygen penetrates into the organic light-emitting diode, the organic material may become degraded, and therefore, an effect such as a decrease in emission efficiency or change in emission color may occur in the organic light-emitting diode. In a case where the cathode electrode, formed of a metal material, is contacted by moisture in the air, the cathode electrode may become oxidized or exfoliated, and therefore, electrical and emission characteristics of the organic light-emitting diode may be deteriorated.

In the organic light-emitting display device according to an embodiment of the present invention, a polymer resin is used as the sealant. Because the polymer resin has an adhesive strength superior to that of the frit, it is possible to improve the bonding strength (e.g., bonding force) between the sealant and the substrate. Because the sealant is bonded to the substrate using UV or IR light it is possible to reduce or prevent the lowering of mechanical stability and reliability of the organic material caused by relatively high-temperature heat.

According to example embodiments of the present invention, a barrier layer is formed on outer surfaces of the substrate and the sealant. Because the barrier layer is made of a transparent inorganic material, the transmittance of the organic light-emitting display device is not reduced or affected, and the penetration of oxygen and/or moisture can be effectively reduced or blocked. Because the barrier layer may be coated on the entire outer surface of a display panel, the sealing effect can be further improved.

Further, because the method for manufacturing the organic light-emitting display device according to the present invention may be performed at a relatively low temperature of, for example, about 100° C. or less, it is possible to reduce or prevent the degradation of the organic material caused by relatively high temperature or heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present invention as set forth in the following claims and their equivalents.

What is claimed is:

1. An organic light-emitting display device comprising:
   a pixel array on a first substrate;
   a second substrate above the first substrate and facing the pixel array;
   a sealant between the first and second substrates and surrounding the pixel array, the sealant comprising a polymer resin; and
   a barrier layer on outer surfaces of the first substrate, the second substrate, and the sealant, the barrier layer comprising an inorganic material.

2. The organic light-emitting display device of claim 1, wherein the polymer resin is a photocurable polymer resin.

3. The organic light-emitting display device of claim 2, wherein the photocurable polymer resin comprises at least one material selected from the group consisting of an epoxy-based material, a urethane-based material, a polyethylene-based material, and a polyimide-based material.

4. The organic light-emitting display device of claim 1, wherein the sealant has a width of about 50 μm to about 1000 μm.

5. The organic light-emitting display device of claim 1, wherein the barrier layer is on side surfaces of the first and second substrates and an outer surface of the sealant.

6. The organic light-emitting display device of claim 1, wherein the barrier layer is on side surfaces and outer surfaces of the first and second substrates and an outer surface of the sealant.

7. The organic light-emitting display device of claim 1, wherein the inorganic material of the barrier layer has a transmittance of 90% or more.

8. The organic light-emitting display device of claim 7, wherein the inorganic material comprises at least one material selected from the group consisting of aluminum oxide, zirconium oxide, and hafnium oxide.

9. The organic light-emitting display device of claim 1, wherein the barrier layer has a thickness of about 10 nm to about 1000 nm.

10. The organic light-emitting display device of claim 1, wherein the barrier layer is a multi-layered structure.

11. The organic light-emitting display device of claim 1, wherein the sealant comprises a nano particle.

12. The organic light-emitting display device of claim 11, wherein the nano particle comprises at least one inorganic material selected from the group consisting of silicon oxide and aluminum oxide.

13. A method for manufacturing an organic light-emitting display device, the method comprising:
    forming a pixel array on a first substrate;
    applying a sealant comprising a polymer resin on a second substrate to surround the pixel array;
    disposing the second substrate above the first substrate to face the pixel array;
    bonding the sealant to the first and second substrates; and
    forming a barrier layer comprising an inorganic material on outer surfaces of the first substrate, the second substrate, and the sealant.

14. The method of claim 13, wherein the polymer resin is a photocurable polymer resin.

15. The method of claim 14, wherein the photocurable polymer resin comprises at least one material selected from the group consisting of an epoxy-based material, a urethane-based material, a polyethylene-based material, and a polyimide-based material.

16. The method of claim 13, wherein the sealant is formed to have a width of about 50 μm to about 1000 μm.

17. The method of claim 13, wherein the bonding of the sealant to the first and second substrates comprises irradiating ultraviolet (UV) or infrared (IR) light onto the sealant.

18. The method of claim 13, wherein the barrier layer is formed on side surfaces of the first and second substrates and an outer surface of the sealant.

19. The method of claim 13, wherein the barrier layer is formed on side surfaces and outer surfaces of the first and second substrates and an outer surface of the sealant.

20. The method of claim 13, wherein the inorganic material of the barrier layer has a transmittance of 90% or more.

21. The method of claim 20, wherein the inorganic material comprises at least one material selected from the group consisting of aluminum oxide, zirconium oxide, and hafnium oxide.

22. The method of claim 13, wherein the barrier layer is formed to have a thickness of about 10 nm to about 1000 nm.

23. The method of claim 13, wherein the barrier layer is formed as a multi-layered structure.

24. The method of claim 13, wherein the barrier layer is formed at a temperature of about 100° C. or less using chemical vapor deposition (CVD).

25. The method of claim 13, wherein the sealant comprises a nano particle.

26. The method of claim 25, wherein the nano particle comprises at least one inorganic material selected from the group consisting of silicon oxide and aluminum oxide.

* * * * *